(12) United States Patent
Ohtsuka et al.

(10) Patent No.: US 6,191,054 B1
(45) Date of Patent: Feb. 20, 2001

(54) METHOD FOR FORMING FILM AND METHOD FOR FABRICATING SEMICONDUCTOR DEVICE

(75) Inventors: Takashi Ohtsuka; Michihito Ueda, both of Osaka (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/413,758

(22) Filed: Oct. 6, 1999

(30) Foreign Application Priority Data

Oct. 8, 1998 (JP) .................................................. 10-286247

(51) Int. Cl.[7] .................................................. H01L 21/469
(52) U.S. Cl. .............................. 438/780; 438/778; 427/35
(58) Field of Search .............................. 427/35, 38, 294, 427/337, 45; 560/177, 127, 261; 438/778, 255, 240, 235, 761, 780

(56) References Cited

U.S. PATENT DOCUMENTS

| | | | |
|---|---|---|---|
| 4,314,071 | * 2/1982 | Babler | 560/127 |
| 4,970,093 | * 11/1990 | Sievers et al. | 427/38 |
| 5,372,850 | 12/1994 | Uchikawa et al. | |
| 5,555,154 | 9/1996 | Uchikawa et al. | |
| 6,025,222 | * 2/2000 | Kimura et al. | 438/240 |

FOREIGN PATENT DOCUMENTS 6-158328   7/1994 (JP) .

* cited by examiner

*Primary Examiner*—David Nelms
*Assistant Examiner*—Phuc T. Dang
(74) *Attorney, Agent, or Firm*—Eric J. Robinson; Nixon Paebody LLP (57) ABSTRACT

In forming a film by a chemical vapor deposition (CVD) process using, as a source material, an organometallic complex dissolved in a solvent, a method for reducing the quantity of carbon compounds mixed into the film is provided. According to this method, a nonpolar solvent is used for dissolving the organometallic complex or an organometallic compound therein. Unlike a polar group contained in a polar solvent, the nonpolar solvent includes no organic molecular group with a large molecular weight to be coordinated with the organometallic complex. Thus, electrical interaction between the organometallic complex and the solvent can be suppressed, and the quantity of carbon compounds mixed into the film can be reduced as a result.

11 Claims, 6 Drawing Sheets

Ba: Ba(DPM)₂-tetraglyme
Sr: Sr(DPM)₂-tetraglyme

DPM

CH3COOC4H9

Tetraglyme

Ti: Ti(O-iPr)₂DPM₂

METHOD FOR FORMING FILM AND METHOD FOR FABRICATING SEMICONDUCTOR DEVICE

BACKGROUND OF THE INVENTION

The present invention relates to a method for forming a film using an organometallic compound or complex as a source material and to a method for fabricating a semiconductor device in accordance with the film forming method.

Recently, as the performance of electronic units has been enhanced, it has become increasingly necessary to use a large-capacity memory such as a dynamic random access memory (DRAM) or a ferroelectric random access memory (FeRAM) or a high-performance device such as an MFS or MFIS transistor as an capacitor thereof. In all of these devices, a capacitive insulating film thereof is made of a material with a high dielectric constant (hereinafter, referred to as a "high-dielectric-constant material") or a ferroelectric material. In FeRAMs and MFS or MFIS transistors, an insulating film is made of a ferroelectric material such as PZT. To realize a DRAM with a storage capacity of 1 gigabits or more, its capacitor for storing electrical charge thereon should also be made of a high-dielectric-constant or ferroelectric material such as Ba—Sr—Ti—O (BST) and Pb—Zr—Ti—O (PZT).

On the other hand, since a DRAM is required to include as large a number of devices as possible on a single chip, the individual devices, including capacitors, should be downsized. For that purpose, the size of a capacitor has been reduced in various manners, while maintaining a sufficient storage capacity by increasing the surface area of the capacitive insulating film. For example, a cylindrical capacitor may be formed or the surface of a storage node may be roughened to form a large number of tiny stepped portions thereon. A similar downsizing requirement is also imposed on FeRAMs and MFS or MFIS transistors.

Thus, in forming a high-dielectric-constant or ferroelectric film, a CVD process is used most often, because a film can be formed over very small stepped portions with good step coverage according to the CVD process. This is why research and development has been vigorously carried on to form a film with good ferroelectric properties by a CVD process.

Examples of CVD processes applicable to deposition of a BST or PZT film include a thermal CVD process. According to the thermal CVD process, organometallic complexes, containing the constituent metal elements of the BST or PZT film, are used as source materials. These organometallic complexes are dissolved in a polar solvent such as butyl acetate or tetrahydrofuran (THF), vaporized, and then introduced into a reaction chamber, thereby causing a chemical reaction such as decomposition or combination among them on a heated substrate. In this case, a plasma-enhanced CVD process, in which the reaction on the substrate is accelerated by plasma generated within the reaction chamber, is sometimes adopted. Also, in the thermal or plasma-enhanced CVD process, a plurality of source materials may be mixed at a predetermined ratio by various techniques. For example, according to a technique, respective solutions of organometallic complexes are mixed at the predetermined ratio and then vaporized. Another technique is vaporizing respective solutions of organometallic complexes and solvents and then mixing the resultant gases at the predetermined ratio.

For instance, in depositing a BST film by a CVD process, three organometallic complexes of $Ba(DPM)_2$, $Sr(DPM)_2$ and $Ti(O\text{-}iPr)_2(DPM)_2$ (where DPM is dipivaloylmethanato) are used as respective source materials, dissolved in butyl acetate at room temperature and then mixed at a predetermined weight ratio. Next, the mixture is introduced into, and vaporized by, a vaporizer that has been heated up to about 220° C. Thereafter, these three organometallic complexes vaporized are introduced into a reaction chamber, in which a substrate has been heated up to about 400° C. to about 700° C. And then these three organometallic complexes vaporized are allowed to react with each other on the substrate, thereby forming a BST film thereon.

Figure 6:
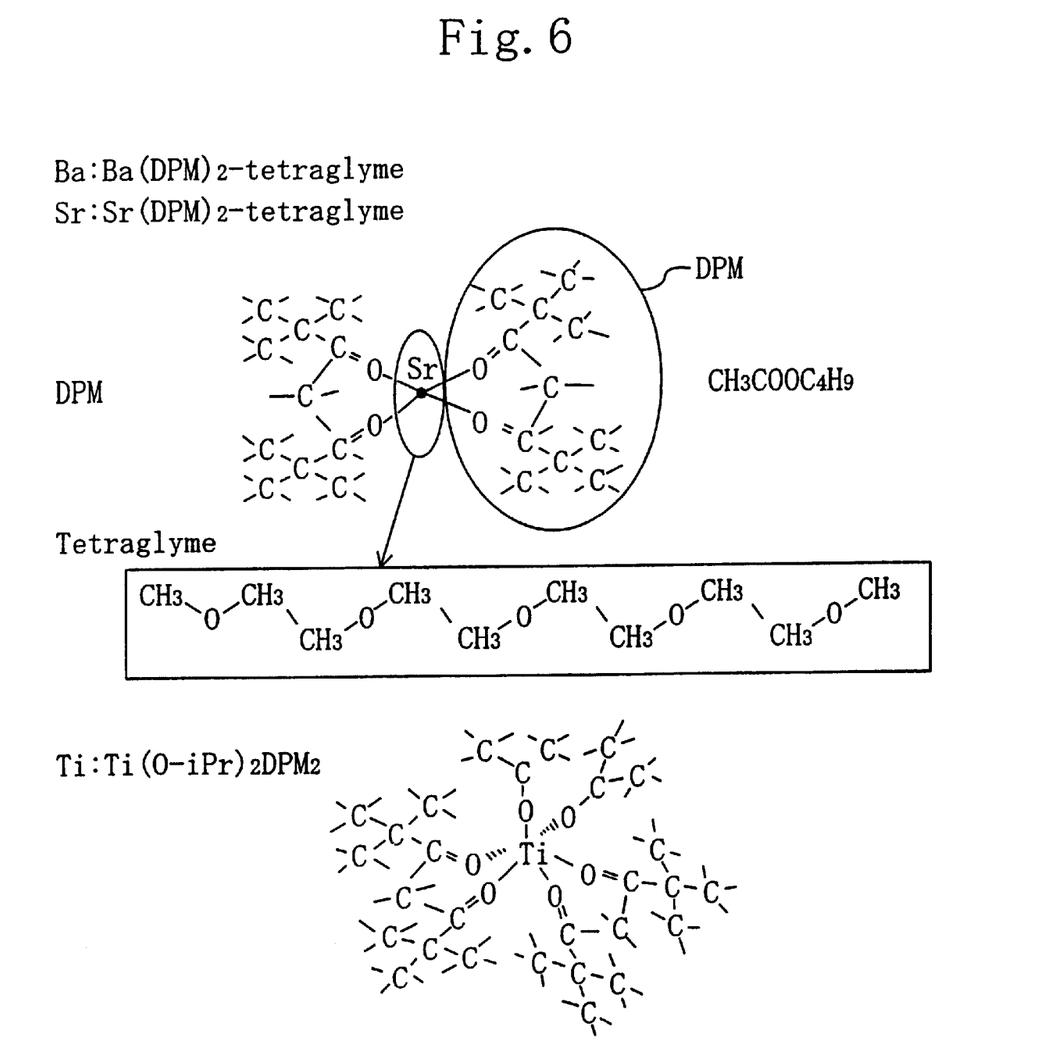
FIG. 6 illustrates molecular structures of source materials and solvent used in a conventional film forming method.

FIG. 6 illustrates molecular states when respective organometallic complexes are allowed to react with each other in a reaction chamber. As shown in FIG. 6, organometallic complexes are more likely to combine with each other to form a copolymer rather than remaining homopolymers, generally speaking. Accordingly, a variation in vaporization temperature or decomposition happens easily. Thus, in many cases, the formation of such a copolymer is prevented by a steric hindrance state, which has been created by a copolymer like a dimer or trimer through the coordination of a so-called "adduct" such as a tetraglyme group.

It is known, however, that a large number of carbon compounds are left within a film formed by a CVD process using these organometallic complexes as source materials. These residual carbon compounds have not caused a serious problem yet in memories like DRAMs and FeRAMs. Nevertheless, the existence of carbon compounds in a dielectric film affects the electrical properties such as dielectric ones. Also, if the residual carbon compounds change into mobile ions, then the ions move along with the electric field resulting from the operation of capacitors and are segregated, thus possibly deteriorating the reliability of the device. Moreover, as the memory cells of a DRAM or FeRAM are further downsized, various inconveniences might be created by the existence of such carbon compounds. MFS and MFIS transistors, on the other hand, are particularly likely to operate erroneously due to the mobile ions. Thus, there is much concern about deterioration in reliability of transistors such as these.

SUMMARY OF THE INVENTION

An object of the present invention is obviating such inconveniences by taking various measures to minimize the quantity of residual carbon compounds in a film that has been deposited by a CVD process using organometallic complexes or compounds as source materials.

A first exemplary film forming method according to the present invention includes the steps of: a) dissolving a source material, including at least an organometallic compound, in a nonpolar solvent; b) vaporizing or liquefying the nonpolar solvent and the source material and then introducing the vaporized or liquefied mixture into a reaction chamber, in which a substrate is placed; and c) allowing the source material to cause a chemical reaction on the substrate, thereby forming a film on the substrate.

In forming a film through the reaction of the source material according to this method, the nonpolar solvent includes substantially no organic molecular groups with large molecular weights. These molecular groups are ordinarily coordinated around an organometallic compound due to electrical interaction between the organometallic compound and a polar group in a polar solvent. This is because, according to the conventional method, the carbon compounds to be mobile ions are probably mixed into a film due to the formation of $H_2O$ during the deposition and the generation of polar groups resulting from the polar solvent dissolved. Thus, by using the nonpolar solvent, the quantity of carbon compounds mixed into the film can be reduced. That is to say, the content of carbon compounds to be mobile ions in the film can be reduced, because the mixture of solvent molecules into the film can be minimized.

In one embodiment of the present invention, the organometallic compound may be contained as an organometallic complex in the source material in the step a).

In another embodiment, the substrate is preferably heated up to 600° C. or less in the step c).

In still another embodiment, at least one solvent, which is selected from the group consisting of hydrocarbon and hydrocarbon halide, is preferably used as the nonpolar solvent in the step a). In such an embodiment, the quantity of hydrocarbon, which is mixed as mobile ions into or left in the film, can be reduced effectively.

In still another embodiment, a material containing dipivaloylmethanato (DPM) may be used as the source material in the step a). In such an embodiment, even when DPM, which ordinarily generates $H_2O$ easily, is used during the deposition process, it is still possible to prevent the carbon compounds to be mobile ions from being mixed into or left in the film.

In still another embodiment, the method may further include the step of making the surface of the substrate hydrophilic before the step c) is performed. In such an embodiment, the deposition of lipophilic groups can be considerably reduced. For example, the surface of the substrate may be easily made hydrophilic by forming an oxide film thereon.

A second exemplary film forming method according to the present invention includes the steps of: a) dissolving a source material, which includes at least an organometallic compound, in a polar solvent; b) vaporizing or liquefying the polar solvent and the source material and then introducing the vaporized or liquefied mixture into a reaction chamber, in which a substrate is placed; and c) allowing the source material to cause a chemical reaction on the substrate, thereby forming a film on the substrate. A quantity of a carbon compound mixed into the film is controlled by polarizing the surface of the substrate.

According to this method, when the polar solvent is dissolved on the surface of the substrate, the quantity of carbon compounds contained in the film can be controlled based on the polarity at the surface of the substrate.

The inventive film forming methods are applicable to a method for fabricating a semiconductor device including: a memory cell with a dielectric or ferroelectric film functioning as information storage on a semiconductor substrate; or a component having, on a semiconductor substrate, a ferroelectric film as a portion for controlling the conductivity within the surface of the substrate.

DESCRIPTION OF THE PREFERRED EMBODIMENTS

Embodiment 1
System and Method for Depositing a Thin Film

Figure 1:
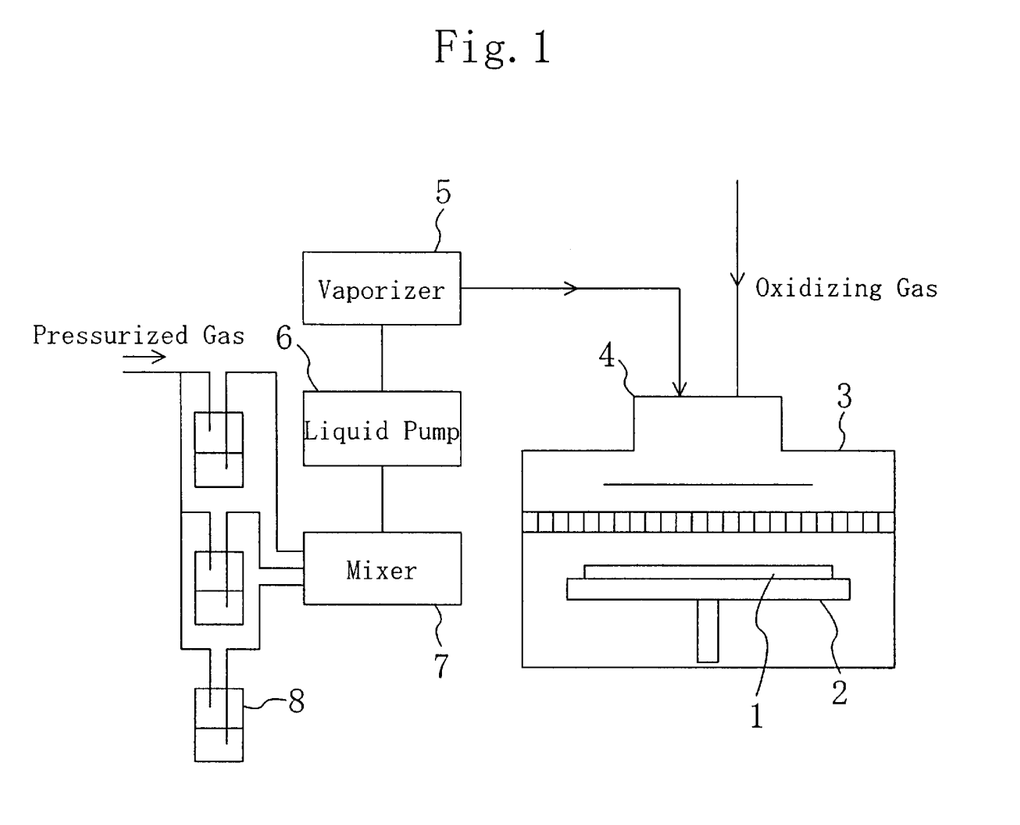
FIG. 1 schematically illustrates a thin-film deposition system used for carrying out a thin-film deposition method according to an embodiment of the present invention.

FIG. 1 schematically illustrates a thin-film deposition system used for carrying out a thin-film deposition method according to first and second embodiments of the present invention. This thin-film deposition system is suitable for carrying out a so-called "solution vaporizing method".

As shown in FIG. 1, the thin-film deposition system includes CVD reaction chamber 3, vaporizer 5, liquid pump 6, mixer 7 and three solution tanks 8. The vaporizer 5 is used for supplying source gases into the reaction chamber 3. The liquid pump 6 is used for pumping a mixture of source solutions into the vaporizer 5. The mixer 7 is used for mixing the respective source solutions. And the respective source solutions are separately reserved in the three solution tanks 8. A stage 2 for heating a substrate 1 thereon is provided inside the reaction chamber 3. In the solution tanks 8, the source solutions, which are obtained by dissolving respective source materials, i.e., organometallic complexes in this case, in a solvent, are reserved. These three solution tanks 8 are provided correspondingly to three types of source solutions. The source solutions, which have been reserved in the solution tanks 8, are mixed by the mixer 7 at an appropriate ratio. Then, the mixture is pumped by the liquid pump 6 into the vaporizer 5, in which the respective source materials are vaporized. Thereafter, these vaporized source gases are introduced into the reaction chamber 3 through an inlet port 4 provided on the top of the reaction chamber 3.

For example, to form a BST thin film on the substrate 1, $Ba(DPM)_2$, $Sr(DPM)_2$ and $Ti(O-iPr)_2(DPM)_2$ are used as source materials and a toluene solvent is prepared as a nonpolar solvent. The principal feature of the present invention lies in using a nonpolar solvent for dissolving source materials (i.e., organometallic compounds or complexes) therein. That is to say, the solution tanks 8 include: a Ba-containing-solution tank; an Sr-containing-solution tank; and a Ti-containing-solution tank. In each of these solution tanks 8, a solution obtained by dissolving an associated source material in the toluene solvent is reserved hermetically.

In this specification, the "nonpolar solvent" has a D value (i.e., the dipole moment) of 0.5 D or less, more preferably 0.1 D or less. For instance, the D value of toluene is 0.37 D. Accordingly, benzene (0.0 D), heptane (0.0 D), octane (0.0 D) and hexane (0.08 D) are also included in the "nonpolar solvents" according to the present invention. Thus, any of these solvents may also be used instead.

To form a thin film, first, the pressures of the source solutions stored in the solution tanks 8 are raised by pressurizing $N_2$ gas to respective values defined by the mixture ratio. Next, these source solutions are fed through respective lines into the mixer 7, where the solutions are mixed at a predetermined ratio. Then, the liquid pump 6 pumps the mixture at a controlled flow rate into the vaporizer 5 that has been heated up to 220° C. In the vaporizer 5, the source materials and toluene solvent, which are contained in the mixture introduced, are vaporized and turned into source gases at the same time. These source gases are introduced through the inlet port 4 into the reaction chamber 3 to reach the substrate 1 placed on the stage 2 that has been heated up to about 450° C. to about 600° C. And a gas phase reaction is caused among the source gases on the surface of the substrate 1, thereby forming a dielectric film on the surface of the substrate 1.

In this embodiment, the mixture solution is once vaporized into source gases using the vaporizer 5 and then the source gases are introduced into the reaction chamber 3. Alternatively, the mixture solution may be introduced into the reaction chamber using a spray. In such an embodiment, a spray is provided instead of the vaporizer 5 and the mixture solution is introduced as spray into the reaction chamber and then deposited on the surface of the substrate 1. Thereafter, the spray deposited is vaporized from the surface of the substrate 1 to cause a gas phase reaction thereon. As a result, a film is formed on the surface of the substrate 1.

Next, it will be described what types of effects are brought about by the use of the nonpolar solvent on the residual carbon compounds in the film.

Experiment on Conventional Method Using Polar Solvent

First, a conventional method will be described. In this comparative example, organometallic complexes with molecular structures such as those shown in FIG. 6, i.e., Ba(DPM)$_2$-tetraglyme, Sr(DPM)$_2$-tetraglyme and Ti(O-iPr)$_2$(DPM)$_2$, are used as respective source materials and butyl acetate, which is a typical polar solvent, is used as a solvent.

The present inventors prepared a comparative sample according to the conventional method in the following manner. First, respective source solutions were obtained by dissolving these organometallic complexes in butyl acetate as a polar solvent and then mixed at a certain ratio at room temperature. Then, the mixture was introduced into a vaporizer that had been heated up to 230° C. and vaporized therein. Subsequently, the source gases obtained were introduced into a reaction chamber. In the reaction chamber, the substrate had been heated up to a temperature arbitrarily selected within the range from 450° C. to 700° C. And a gas phase reaction was produced among these source gases on the heated substrate, thereby forming a BST film on the substrate. In this comparative example, a multilayer structure, in which SiO$_2$, TiO$_2$ and Pt films had been stacked in this order on an Si substrate, was used as the substrate.

To estimate the quantity of residual carbon compounds in the BST film, the present inventors carried out a thermal desorption spectroscopy (TDS) analysis on the BST film within vacuum and analyzed carbon-containing ions within the BST film according to a time-of-flight secondary ion mass spectrometry (TOF-SIMS).

Figure 2:
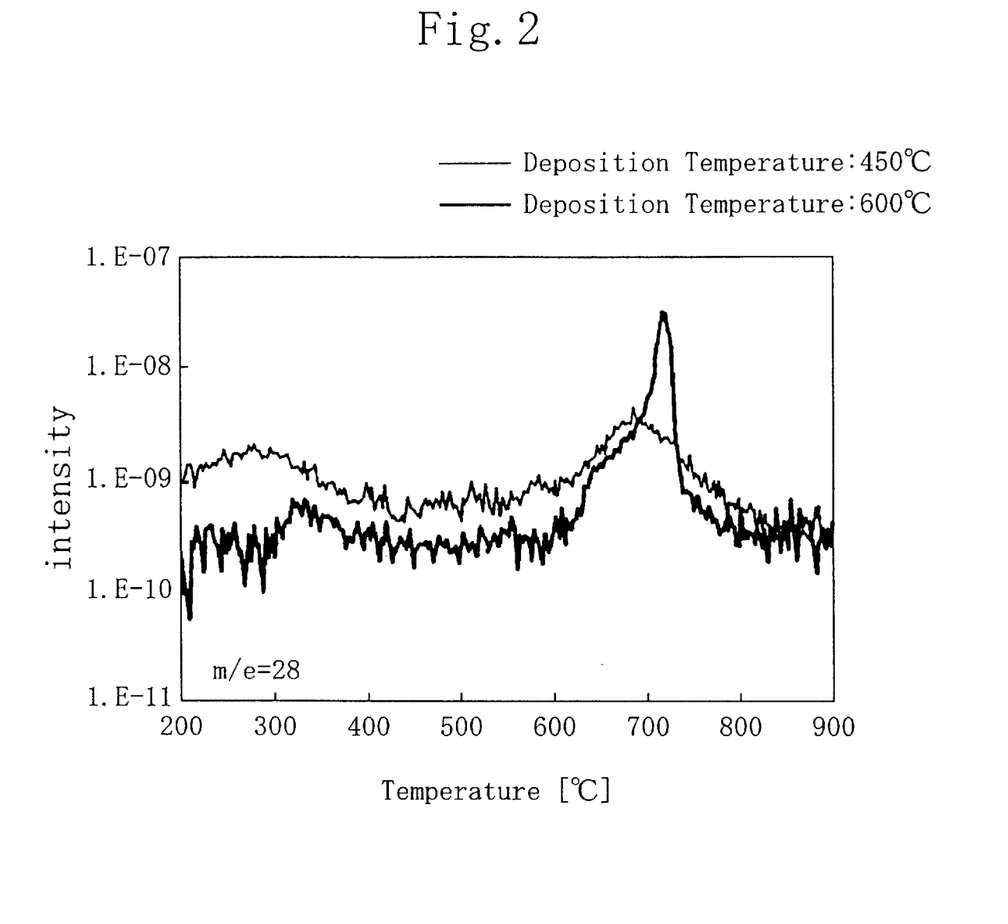
FIG. 2 illustrates data obtained by a TDS analysis performed to estimate the quantity of carbon desorbed from a BST film.

FIG. 2 illustrates TDS analysis data on the BST film formed by the conventional method. In FIG. 2, the axis of abscissas represents the temperature (°C.) of the sample when analyzed (hereinafter, simply referred to a "as-analyzed temperature"), while the axis of ordinates represents the quantity of Co desorbed (m/e=28), which might result from the residual carbon compounds in the BST film. In FIG. 2, data about two samples that were deposited with the substrate heated up to 450° C. and 600° C., respectively (hereinafter, simply referred to as "as-deposited temperature"), are illustrated as typical examples. As shown in FIG. 2, the results of the TDS analysis show that the peaks of Co desorption are located in the as-analyzed temperature range from about 600° C. to about 700° C. in both of these samples corresponding to the as-deposited temperatures of 450° C. and 600° C. It was also found that a larger quantity of CO desorbed from the sample corresponding to the as-deposited temperature of 450° C. than from the sample corresponding to the as-deposited temperature of 600° C. That is to say, a larger quantity of CO desorbed from a sample that had been deposited at the lower temperature than from a sample that had been deposited at the higher temperature. Furthermore, when all the materials desorbed from the BST film were analyzed, almost all of them turned out to be CO.

The present inventors also made a new finding during the TOF-SIMS analysis of the residual carbon compounds in the BST film.

Figure 3:
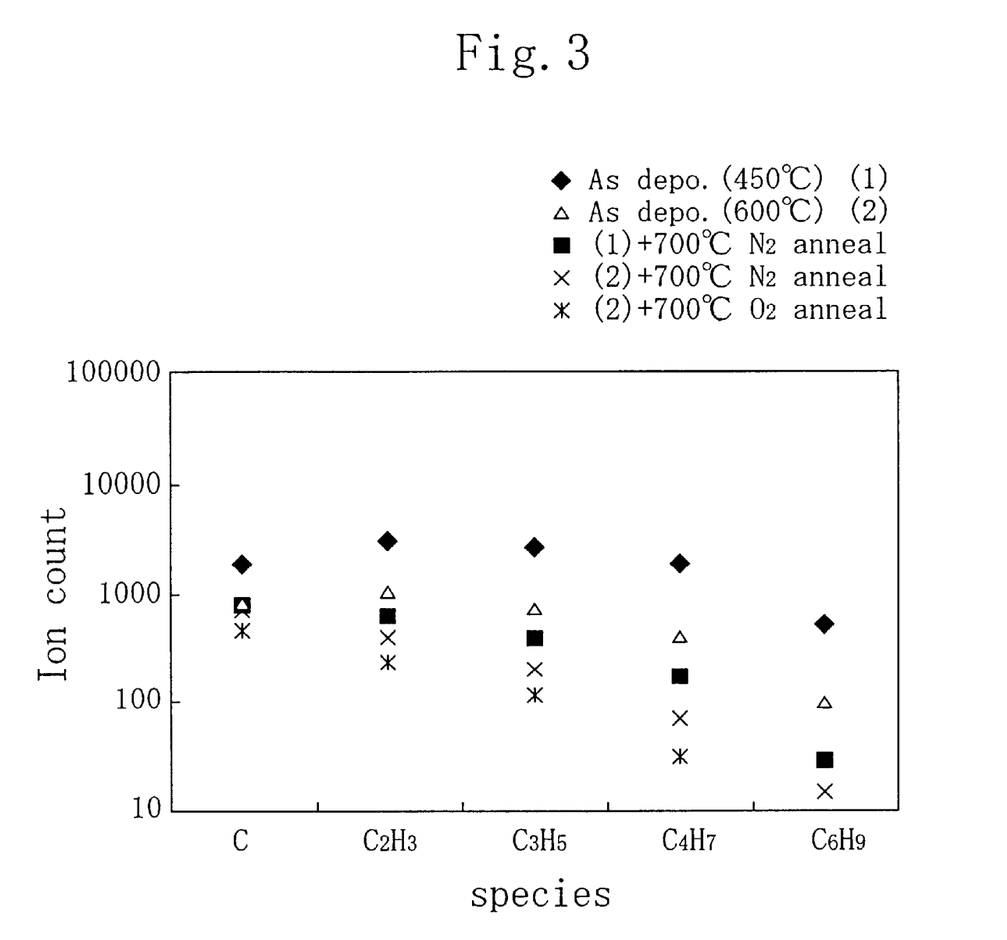
FIG. 3 illustrates data obtained by a TOF-SIMS analysis performed to estimate the quantity of residual carbon compounds in a BST film.

FIG. 3 illustrates TOF-SIMS analysis data on the BST film formed by the conventional method using a polar solvent. In FIG. 3, the axis of abscissas represents ion species, while the axis of ordinates represents the count of ions obtained by the analysis. Five samples were analyzed: one of them was deposited at 450° C. and not treated after that (As depo. (450° C.)(1)); another one was deposited at 600° C. and not treated after that (As depo. (600° C.)(2)); another one was deposited at 450° C. and then annealed within N$_2$ gas at 700° C. ((1) +700° C. N$_2$ anneal); another one was deposited at 600° C. and then annealed within N$_2$ gas at 700° C. ((2)+700° C. N$_2$ anneal); and the other was deposited at 600° C. and then annealed within O$_2$ gas at 700° C. ((1)+700° C. O$_2$ anneal). In the illustrated example, only positive ion species were counted. As a result, ions with relatively large molecular weights such as $C_2H_3$, $C_3H_5$, $C_4H_7$ and $C_6H_9$ were detected as respective masses. In general, while a molecule is being detected by mass spectrometry, the molecule might be decomposed to a certain degree. Thus, it was found that carbon compounds might have actually been left as rather large molecules in the BST film.

Considering the number of carbon atoms, such carbon compounds with large molecular weights might result from tetraglyme adducts, butyl acetate as the polar solvent and the DPM group. In this case, it was butyl acetate and tetraglyme adducts that were introduced into the reaction chamber in large quantities. Moreover, during the TOF-SIMS analysis, ions probably resulting from acetate ions, such as negative ions HCOO, were also detected in addition to the ions illustrated in FIG. 4. Furthermore, tetraglyme used as an adduct has a boiling point as high as 275.3° C. On the other hand, although butyl acetate has a boiling point of 118° C., the butyl acetate molecules are probably stable. In view of these respects, a majority of the carbon compounds in the BST film would have probably come from the polar solvent (butyl acetate) or adducts.

The results of the TOF-SIMS analysis also show that a larger quantity of carbon compounds were mixed into the BST film in a sample deposited at a relatively low temperature than that deposited at a relatively high temperature, and that the ion species counted considerably decreased if annealing was performed after the deposition. As for the samples that were annealed after the deposition, the counts of ion species with large molecular weights decreased particularly significantly. It was also found that if the deposition temperature was 600° C. or less, the final quantity of residual carbon compounds in the BST film did not change so much with the deposition temperature. When the crystallinity of the samples deposited at 450° C. and 600° C., respectively, was evaluated by X-ray diffraction (XRD), it was found that the sample deposited at 450° C. was amorphous, while the sample deposited at 600° C. had been crystallized.

These statements are probably applicable not just to the BST film, but also to a dielectric film in general that has been formed using organometallic compounds or complexes.

Based on these findings, the present inventors supposed the polar solvent to be a main factor of mixing residual carbon compounds into a dielectric film that had been formed by the conventional method using the organometallic compounds or complexes. And we carried out experiments to confirm this supposition.

Experiments on BST Film Formed with Nonpolar Solvent

Figure 4:
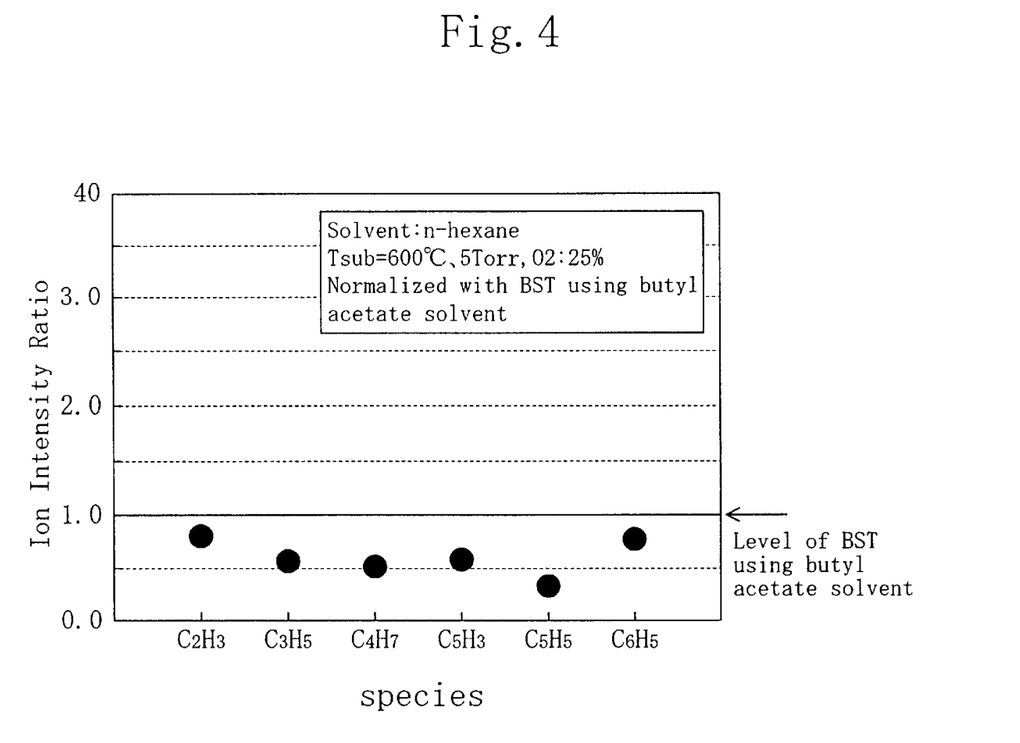
FIG. 4 illustrates in comparison data about respective quantities of residual carbon compounds in a BST film using a nonpolar solvent according to the present invention and a polar solvent according to the conventional method.

FIG. 4 illustrates the TOF-SIMS analysis data on a BST film that was formed by a method according to the present invention using n-hexane as a nonpolar solvent. In FIG. 4, the axis of abscissas represents the ion species, while the axis of ordinates represents the ion intensity ratio that is normalized based on the data about the prior art samples shown in FIG. 3. In the sample according to this embodiment, about which the data shown in FIG. 4 was obtained, a BST film was formed without annealing under the conditions that the substrate temperature $T_{sub}$ was 600° C., the gas pressure within the reaction chamber was 5 Torr (=about 666.5 Pa) and 25% $O_2$ gas was introduced into the reaction chamber. The source gases were produced as described above. Thus, the ion intensity ratios are plotted as ordinates in FIG. 4 with the ion count, corresponding to the data of the sample Δ shown in FIG. 3 (i.e., the sample that was deposited at 600° C. and not treated after that (As depo. (600° C.)(2)), regarded as a unity. It should be noted that the data about other ion species such as C, which were generated from portions other than the BST film and for which sufficient precision was not ensured, is omitted from FIG. 4.

As shown in FIG. 4, the quantity of residual carbon compounds in the sample BST film formed by the method according to the present invention is much smaller than that in the BST film formed by the prior art. That is to say, this data supports the inventive effect that the quantity of residual carbon compounds in a dielectric film formed by using organometallic compounds or complexes can be reduced by the method of the present invention.

Reduction of Residual Carbon Compounds According to the Present Invention

Next, it will be described how the quantity of carbon compounds mixed into a film can be reduced if a nonpolar solvent is used for dissolving the organometallic compounds or complexes therein as is done in the present invention.

As described above, HCOO, which is one of the negative ion species detected by the TOF-SIMS, is contained in butyl acetate. When a dielectric film such as a BST film is formed, the decomposition and gas phase reaction of a solvent and organometallic complexes (or compounds) might take place in a complicated manner. Thus, the elementary reactions thereof have not been clarified completely yet. However, taking the results of XRD evaluation on crystallinity into account as well, the carbon compounds might be mixed into the BST film according to the conventional method probably in the following manner.

First, the organometallic complexes are dissolved in butyl acetate as a polar solvent to prepare respective source solutions, which are mixed at a predetermined ratio in the liquid state (at room temperature). Then, the mixture solution is introduced into a vaporizer that has been heated up to 230° C. and vaporized therein into source gases. In this case, the organometallic complexes (or compounds) with adducts, the single substance adducts, and the solvent are vaporized. Subsequently, these vaporized source molecules are introduced into the reaction chamber to cause a gas phase reaction on the surface of a substrate. The elementary process this reaction is unclear, but the decomposition of respective source molecules might occur concurrently with the formation of the BST film.

As described above, it can be seen from the results of the XRD analysis that BST crystals have not been formed yet at 450° C., but have already been formed at 600° C. Also, the results of the TDS and TOF-SIMS analyses show that carbon compounds start to desorb from the BST film around at 600° C. irrespective of the deposition temperature. Thus, the residual carbon compounds in the BST film may be classified into the two groups: the compounds associated with the crystallization process of the BST film; and those that are not.

Examples of the compounds associated with the crystallization process of the BST film include: compounds resulting from DPM complexes; and compounds resulting from the adducts coordinated with a metal atom. When a polar solvent is used, an electrical interaction is induced between the polar groups in the polar solvent and the organometallic complexes. As a result, the polar groups are coordinated just like adducts. Accordingly, the polar groups in the polar solvent are introduced into the BST film while the BST crystals are being formed.

In contrast, according to the method of the present invention, a nonpolar solvent, such as toluene, is used. Since the nonpolar solvent includes substantially no groups that would be coordinated with the organometallic complexes due to the electrical interaction, the quantity of carbon compounds mixed into the dielectric film decreases.

Also, residual carbon compounds, which have been mixed during various processes other than the crystallization, change their quantity depending on whether or not heating ambient is oxidizing, i.e., how much the carbon compounds have burned. Thus, to reduce the quantity of residual carbon compounds of this type, it is effective to reduce the molecular weight of the carbon ion species introduced during the deposition. In other words, the molecular weight of the nonpolar solvent is preferably as small as possible. For example, when an aromatic hydrocarbon solvent is used, toluene is preferred to xylene and benzene is preferred to toluene. On the other hand, when a straight-chain hydrocarbon solvent is used, heptane is preferred to octane and hexane is preferred to heptane. Furthermore, a hydrocarbon halide solvent with a low molecular weight and a small dipole moment, such as carbon tetrachloride, is also preferred. We already confirmed based on the results of the TOF-SIMS analysis that residual fluorine and chlorine, resulting from hydrocarbon halide, can be desorbed relatively easily through annealing.

It is also known that if the substrate temperature is set at about 650° C. or less while the BST film is being formed in the above-described manner, a region called "haze" with a non-uniform composition comes to exist in the resultant BST film to deteriorate the leakage properties of the BST film. To solve such a problem, various measures have been taken to suppress the generation of the haze by adjusting process parameters such as deposition pressure, concentrations of source materials and flow rates of gases. None of these measures, however, has ever succeeded in solving the problem completely.

The present inventors suppose that the haze would be caused mainly by the reaction between the Ti source with an alkoxide group and the solvent. Thus, we found that the haze can be eliminated almost completely by using a nonpolar solvent (e.g., hydrocarbon) doing little damage on the alkoxide group as is done in this embodiment. That is to say, in forming the BST film, not only reduction of residual carbon compounds, but also suppression of haze are realized according to the present invention.

Applicability of the Inventive Method to the Fabrication of Semiconductor Devices In a fabrication process of a DRAM, the inventive thin-film deposition method is applicable to forming a charge-storable capacitive insulating film for a memory cell. In such a case, since the quantity of residual carbon compounds, which affect the dielectric properties of the capacitive insulating film, can be reduced, a highly reliable DRAM can be obtained.

In a fabrication process of an FeRAM on the other hand, the inventive thin-film deposition method is applicable to forming a ferroelectric capacitor for storing thereon polarization information within a memory cell, which is made of a ferroelectric such as $SrBi_2Ta_2O_9$ or $Pb(Zr_xTi_{1-x})O_3$. In such a case, a highly reliable FeRAM can also be obtained just like the case of DRAM.

Moreover, in a fabrication process of an MFS transistor, the inventive thin-film deposition method is applicable to forming a ferroelectric gate insulating film between a semiconductor substrate and a gate electrode. In such a case, since the quantity of residual carbon compounds in the ferroelectric gate insulating film can be reduced, it is possible to prevent the dielectric properties thereof from being affected adversely. In addition, it is also possible to prevent the transistor from operating erroneously due to mobile ions resulting from the residual carbon compounds. As a result, a highly reliable MFS transistor can be obtained.

Furthermore, in a fabrication process of an MFIS transistor, the inventive thin-film deposition method is applicable to forming a ferroelectric gate insulating film between a semiconductor substrate and a gate electrode and forming an insulating film between the ferroelectric film and the semiconductor substrate. In such a case, a highly reliable MFIS transistor can also be obtained just like the case of MFS transistor.

In addition, similar effects can also be attained by applying the present invention to forming an Ru metal film using $ORu(DPM)_3$ or a Pt film using $(CH_3C_5H_4)(CH_3)_3Pt$.

Embodiment 2

In a second exemplary embodiment of the present invention, a method for controlling the quantity or types of carbon compounds mixed into a dielectric film by treating the surface of a substrate will be described. The surface treatment of the substrate includes controlling the charged state at the surface of the substrate and introducing hydrophilic or hydrophobic groups into the surface. In this embodiment, the thin-film deposition system shown in FIG. 1 may also be used as well.

Figure 5:
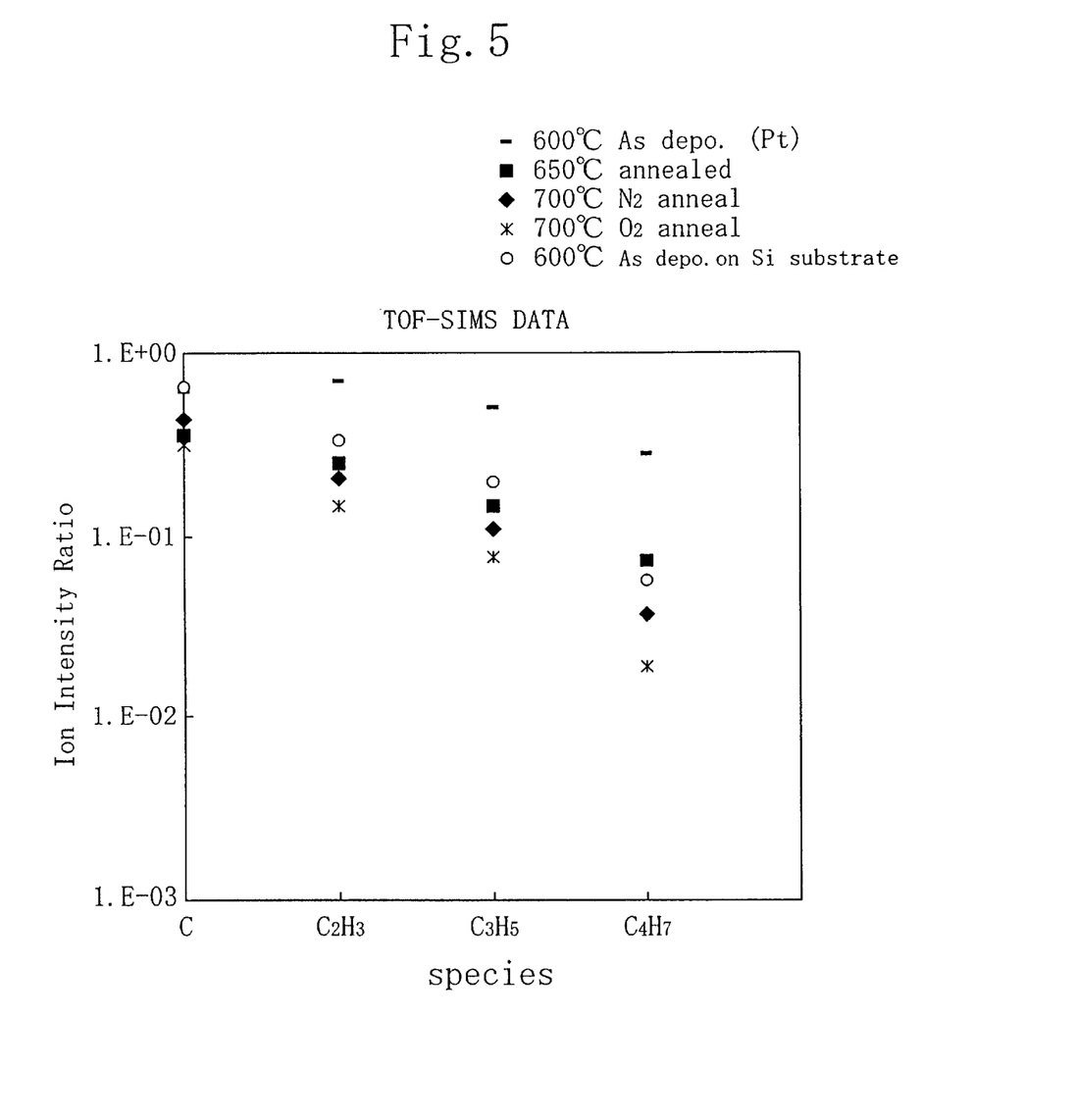
FIG. 5 illustrates data obtained by a TOF-SIMS analysis to show a difference in quantity of carbon mixed into a film depending on the types of substrates.

FIG. 5 illustrates results of a TOF-SIMS analysis on BST films that were respectively formed using a polar solvent over a Pt layer and an Si layer on the surface of the substrate. In FIG. 5, the axis of abscissas represents ion species, while the axis of ordinates represents the ion intensity ratio. Five samples were analyzed: one of them was deposited on the Pt layer at 600° C. and not treated after that (600° C. As depo. (Pt)); another one was deposited on the Pt layer at 600° C. and then annealed at 650° C. (650° C. annealed); another one was deposited on the Pt layer at 600° C. and then annealed within $N_2$ gas at 700° C. (700° C. $N_2$ anneal); another one was deposited on the Pt layer at 600° C. and then annealed within $O_2$ gas at 700° C. (700° C. $O_2$ anneal); and the other was deposited on the Si layer at 600° C. and not treated after that (600° C. As depo. on Si substrate).

As can be seen from the TOF-SIMS results shown in FIG. 5, even when two BST films were deposited at the same temperature of 600° C., the BST film deposited on the Pt layer might contain a larger quantity of carbon compounds than the BST film deposited on the Si layer.

In this case, the Si layer is hydrophilic, because a native oxide film has been formed thereon. In contrast, the Pt layer does not include any oxide film thereon in its native state, and therefore is lipophilic, not hydrophilic. It was also found that the BST film deposited on the Si layer contained a smaller quantity of hydrocarbon than the BST film deposited on the Pt layer. As can be seen, if the lipophilic Pt layer is the surface layer, then a larger quantity of hydrocarbon, which is a lipophilic group, adsorbs into the Pt layer, thus increasing the quantity of carbon compounds introduced into the BST film overlying the Pt layer. On the other hand, the contents of hydrophilic groups, which had been detected as negative ions in the TOF-SIMS analysis, were not so different whether the BST film was formed on the Si layer or the Pt layer. Accordingly, it can be seen that the substrate with a hydrophilic surface effectively contributes to the reduction in quantity of carbon compounds, including the lipophilic groups, to be mixed into the BST film.

Also, even with a substrate on which a lipophilic Pt layer is formed, if the uppermost layer of the substrate is turned into hydrophilic by further forming an oxide film (Pt—O) on the Pt layer, the same effects can be attained.

In this case, if the oxide film (Pt—O) is formed over the Pt layer on the surface of the substrate, then the Pt layer is not only changed into hydrophilic but also charged. In general, the Si layer is charged, because this layer is made of a semiconductor. On the other hand, the Pt layer is not charged, because this layer is made of a metal. Thus, the effects of this embodiment can also be attained by controlling the charged state at the surface of the substrate.

As described above, the thin-film deposition method according to this embodiment is characterized by depositing a film while controlling the charged state or the hydrophilicity or hydrophobicity at the surface of a substrate. Also, if the charged state or the hydrophilicity or hydrophobicity at the surface of a substrate is controlled, then the types of carbon compounds mixed into the dielectric film can be changed and the quantity thereof can also be controlled.

Applicability of the Inventive Method to the Fabrication of Semiconductor Devices In a fabrication process of a DRAM, the inventive thin-film deposition method is applicable to forming a charge-storable capacitive insulating film for a memory cell. In such a case, since the quantity of residual carbon compounds, which affect the dielectric properties of the capacitive insulating film, can be reduced, a highly reliable DRAM can be formed.

In a fabrication process of an FeRAM on the other hand, the inventive thin-film deposition method is applicable to forming a ferroelectric capacitor for storing thereon polarization information within a memory cell, which is made of a ferroelectric such as $SrBi_2Ta_2O_9$ or $Pb(Zr_xTi_{1-x})O_3$. In such a case, a highly reliable FeRAM can also be obtained just like the case of DRAM.

Moreover, in a fabrication process of an MFS transistor, the inventive thin-film deposition method is applicable to forming a ferroelectric gate insulating film between a semiconductor substrate and a gate electrode. In such a case, since the quantity of residual carbon compounds in the ferroelectric gate insulating film can be reduced, it is possible to prevent the dielectric properties thereof from being affected adversely. In addition, it is also possible to prevent the transistor from operating erroneously due to mobile ions resulting from the residual carbon compounds. As a result, a highly reliable MFS transistor can be obtained.

Furthermore, in a fabrication process of an MFIS transistor, the inventive thin-film deposition method is applicable to forming a ferroelectric gate insulating film between a semiconductor substrate and a gate electrode and forming an insulating film between the ferroelectric film and the semiconductor substrate. In such a case, a highly reliable MFIS transistor can also be obtained just like the case of MFS transistor.

What is claimed is:

1. A method for forming a film, comprising the steps of:
    a) dissolving a source material, which includes at least an organometallic compound, in a nonpolar solvent;
    b) vaporizing or liquefying the nonpolar solvent and the source material and then introducing the vaporized or liquefied mixture into a reaction chamber, in which a substrate is placed; and
    c) allowing the source material to cause a chemical reaction on the substrate, thereby forming the film on the substrate.

2. The method of claim 1, wherein in the step a), the organometallic compound is contained as an organometallic complex in the source material.

3. The method of claim 1, wherein in the step c), the substrate is heated up to 600° C. or less.

4. The method of claim 1, wherein in the step a), at least one solvent, which is selected from the group consisting of hydrocarbon and hydrocarbon halide, is used as the nonpolar solvent.

5. The method of claim 1, wherein in the step a), a material containing dipivaloylmethanato is used as the source material.

6. The method of claim 1, further comprising the step of making the surface of the substrate hydrophilic before the step c) is performed.

7. The method of claim 6, wherein an oxide is formed on the surface of the substrate to make the surface hydrophilic.

8. A method for forming a film, comprising the steps of:
    a) dissolving a source material, which includes at least an organometallic compound, in a polar solvent;
    b) vaporizing or liquefying the polar solvent and the source material and then introducing the vaporized or liquefied mixture into a reaction chamber, in which a substrate is placed; and
    c) allowing the source material to cause a chemical reaction on the substrate, thereby forming the film on the substrate,
    wherein a quantity of a carbon compound mixed into the film is controlled by polarizing the surface of the substrate.

9. A method for fabricating a semiconductor device including a memory cell with a dielectric film functioning as information storage on a semiconductor substrate, the method comprising the steps of:
    a) dissolving a source material, which includes at least an organometallic compound, in a nonpolar solvent;
    b) vaporizing or liquefying the nonpolar solvent and the source material and then introducing the vaporized or liquefied mixture into a reaction chamber, in which the substrate is placed; and
    c) allowing the source material to cause a chemical reaction on the substrate, thereby forming the dielectric film on the substrate.

10. A method for fabricating a semiconductor device including a memory cell with a ferroelectric film functioning as information storage on a semiconductor substrate, the method comprising the steps of:
    a) dissolving a source material, which includes at least an organometallic compound, in a nonpolar solvent;
    b) vaporizing or liquefying the nonpolar solvent and the source material and then introducing the vaporized or liquefied mixture into a reaction chamber, in which the substrate is placed; and
    c) allowing the source material to cause a chemical reaction on the substrate, thereby forming the ferroelectric film on the substrate.

11. A method for fabricating a semiconductor device including, on a semiconductor substrate, a component having a ferroelectric film as a portion for controlling the conductivity within the surface of the substrate, the method comprising the steps of:
    a) dissolving a source material, which includes at least an organometallic compound, in a nonpolar solvent;
    b) vaporizing or liquefying the nonpolar solvent and the source material and then introducing the vaporized or liquefied mixture into a reaction chamber, in which the substrate is placed; and
    c) allowing the source material to cause a chemical reaction on the substrate, thereby forming the ferroelectric film on the substrate.

* * * * *